United States Patent [19]

Cirillo, Jr. et al.

[11] Patent Number: 4,662,058

[45] Date of Patent: May 5, 1987

[54] SELF-ALIGNED GATE PROCESS FOR ICS BASED ON MODULATION DOPED (AL,GA) AS/GAAS FETS

[75] Inventors: Nicholas C. Cirillo, Jr., Minneapolis; Max J. Helix; Stephen A. Jamison, both of Bloomington, all of Minn.

[73] Assignee: Honeywell Inc., Minneapolis, Minn.

[21] Appl. No.: 668,586

[22] Filed: Nov. 5, 1984

[51] Int. Cl.⁴ .................... H01L 21/205; H01L 21/28
[52] U.S. Cl. .................................. 29/571; 29/576 B; 29/591; 148/1.5; 148/175; 148/187
[58] Field of Search .................. 29/571, 576 B, 591; 148/1.5, 187, 175

[56] References Cited

U.S. PATENT DOCUMENTS

| | | | |
|---|---|---|---|
| 3,994,758 | 11/1976 | Ogawa et al. | 29/578 X |
| 4,300,148 | 11/1981 | Niehans et al. | 29/571 X |
| 4,330,343 | 5/1982 | Christou et al. | 29/571 X |
| 4,489,480 | 12/1984 | Martin et al. | 29/576 B |
| 4,503,600 | 3/1985 | Nii et al. | 29/571 |
| 4,534,103 | 8/1985 | Cho et al. | 29/571 |
| 4,545,109 | 10/1985 | Reichert | 29/571 |

OTHER PUBLICATIONS

T. Ishikawa, et al, "The Effect of Annealing on the Electrical Properties of Selectively Doped GaAs/-N-AlGaAs Heterojunction Structures Grown by MBE", Japanese J. of Applied Physics, vol. 20, No. 11, Nov. 1981, pp. L814-L816.

Piotrowski et al., "Ohmic Contacts to III-IV Compound Semiconductors: A Review of Fabrication Techniques, *Solid-State Electronics*, vol. 26, No. 6, pp. 179-197, 1983, Pergamon Press, Ltd., Great Britain.

M. D. Feuer, et al, "High-Speed Low-Voltage Ring Oscillators Based on Selectively Doped Heterojunction Transistors", IEEE Electron Device Letters, vol. EDL-4, No. 9, pp. 306-307, 1983.

*Primary Examiner*—George T. Ozaki
*Attorney, Agent, or Firm*—Omund R. Dahle

[57] ABSTRACT

A self-aligned gate process for integrated circuits based on modulation doped (Al, Ga)As/GaAs field effect transistors and in which the regions on each side of the metal silicide gate are heavily ion implanted to form the low resistance regions on either side of the gate.

16 Claims, 5 Drawing Figures

SELF-ALIGNED GATE PROCESS FOR ICS BASED ON MODULATION DOPED (AL,GA) AS/GAAS FETS

BACKGROUND AND SUMMARY OF THE INVENTION

The U.S. Government has certain rights in this invention pursuant to the terms of a contract F33615-83-C-1068.

This invention is directed to a self-aligned gate process for integrated circuits based on modulation doped (Al,Ga)As/GaAs field effect transistors (MODFETs).

In the prior art there have been published references on modulation doped (Al,Ga)As/GaAs FETs fabricated using a recessed gate process. One such reference is by M. D. Feuer et al, "High-Speed Low-Voltage Ring Oscillators Based on Selectively Doped Heterojunction Transistors", IEEE Electron Device Letters, Vol.EDL-4, No. 9, pp. 306–307, 1983.

The present invention process is significantly different and improved from the prior art in the use of ion implantation to form the low resistance regions on either side of the gate and the saturated resistor loads. This improved process has significant advantages over the prior art in that:

- the process is completely planar for processing simplicity;
- the ion implantation of the regions on either side of the gate results in lower source and drain resistances for higher drain-to-source current and higher extrinsic transconductance;
- the ion implantation of the saturated resistor regions allows the load current to be optimized separately from the FET;
- the use of a rapid annealing system activates the implanted regions without causing Si or impurity drift which changes the threshold voltage of the devices and lowers the high mobility of the two-dimensional electron gas resulting in poor devices; and
- the process does not require a recessed gate structure to lower the source resistance so the threshold voltage control and uniformity is superior.

DESCRIPTION

It is the objective of this invention to fabricate devices and integrated circuits based on modulation or selectively doped (Al,Ga)As/GaAs field effect transistors with low source resistance for high extrinsic transconductance and good threshold voltage uniformity. This is accomplished by using ion implantation to create a heavily doped n+ region on either side of the gate of the FET to reduce the high intrinsic sheet resistance of the two-dimensional electron gas that exists at the (Al,Ga)As/GaAs heterointerface. No recess etch of the material is required under the gate region resulting in superior threshold voltage uniformity.

Figure 1:
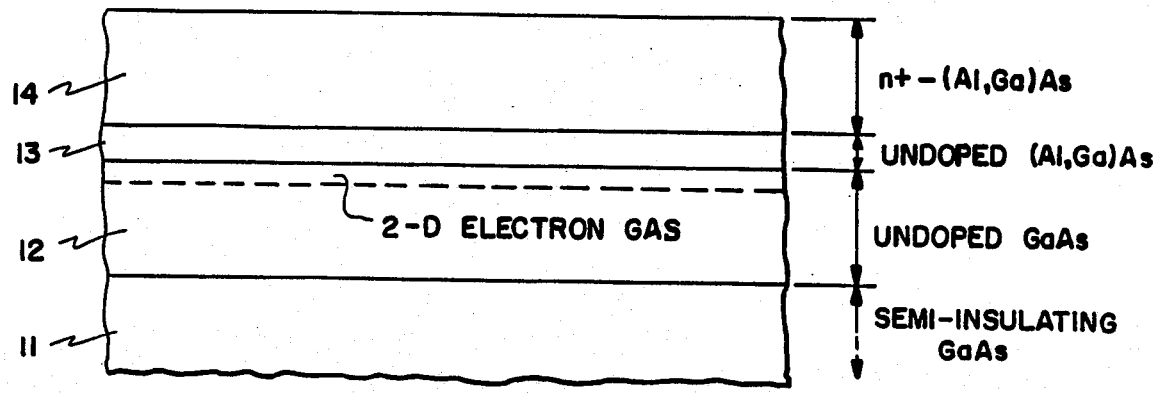
FIGS. 1-3 are cross sectional views showing progressive steps in the fabrication of the planar self-aligned MODFET structure.
Figure 2:
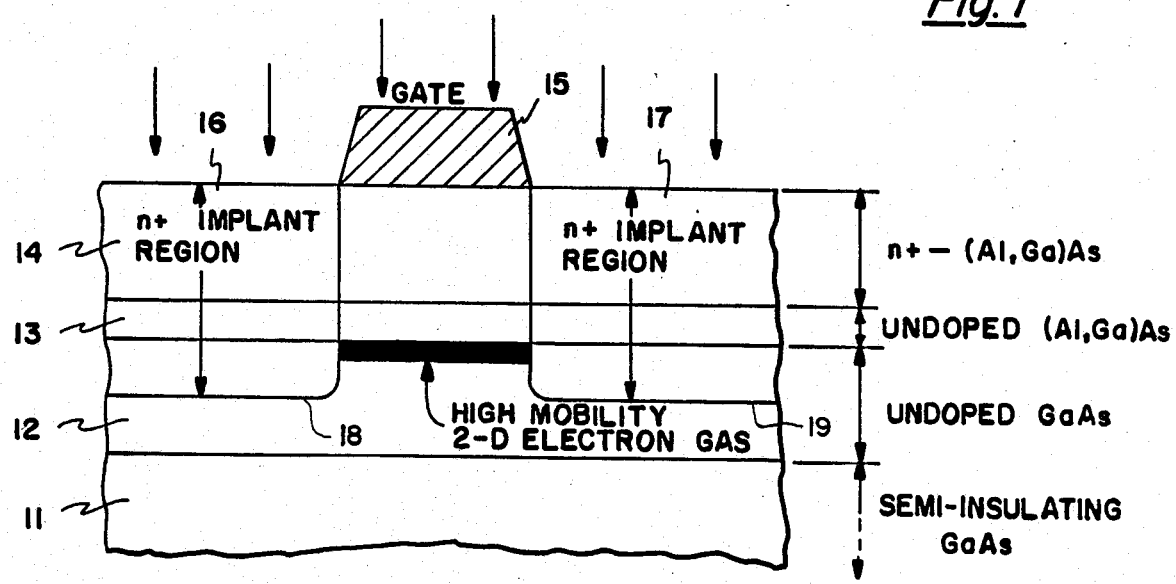
Figure 3:
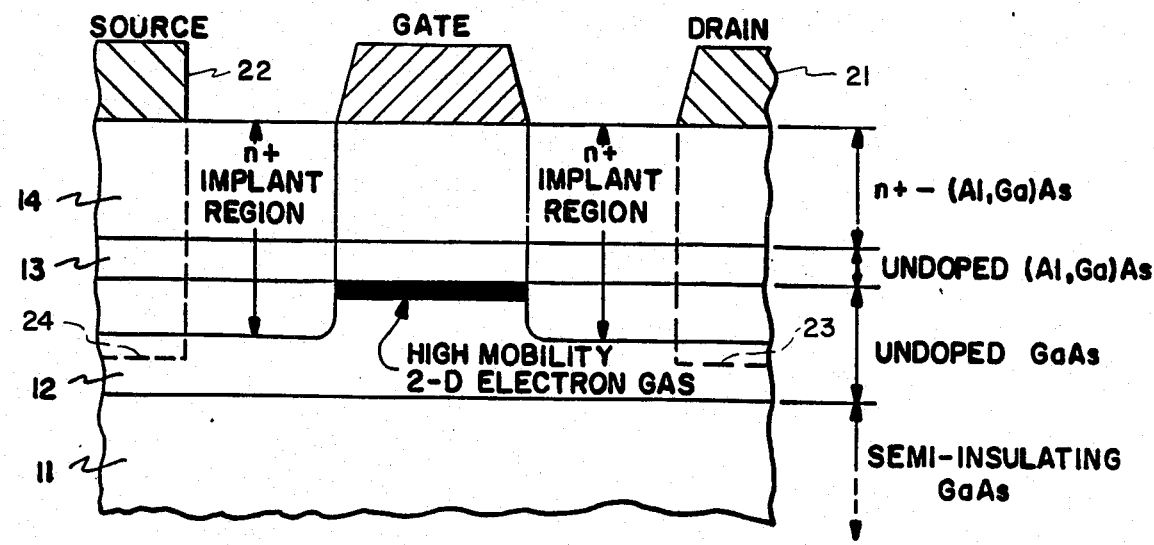

Referring now to FIGS. 1-3 there is shown a cross-section view of one embodiment of a completely planar, MODFET structure according to the invention. FIG. 1 shows a <100>-oriented semi-insulating GaAs substrate wafer 11 upon which the modulation-doped (Al,Ga)As/GaAs heterostructures are grown by molecular-beam epitaxy. An updoped GaAs layer 12 is first grown followed by an undoped (Al,Ga)As layer 13 and then a n+-(Al,Ga)As layer 14. Uniformity of thickness and doping is very important since the FET threshold voltage depends on the $Nd^2$ product, where N is the doping and d is the thickness of the doped (Al,Ga)As layer.

Although the embodiment shown has an epitaxial layer of undoped GaAs followed by an epitaxial layer of undoped (Al,GA)As and then an epitaxial layer of n+(Al,Ga)As other embodiments may vary the order of the grown epitaxial layers. The important part is in growing the appropriate series of epitaxial layers to form a high-mobility high-carrier concentration two dimensional electron gas.

In order to provide the self-aligned gate the metal gate 15 is deposited, FIG. 2. In a preferred embodiment a refractory metal or metal silicide $MSi_x$ (where $x \geq 0$), such as titanium tungsten silicide (TiWSi), is deposited to form the gate 15. The regions 16 and 17 on either side of the metal silicide gate, extending to the ohmic contact regions, as delineated by lines 18 and 19 are heavily ion implanted with a donor species, such as Si, the gate 15 preventing any of the ion implant beneath itself and so providing the self-aligned gate structure. Other regions on the wafer may also be selectively ion implanted with the donor species where saturated resistor loads are required to form logic gates when properly combined with the FET device.

The wafer shown in FIG. 2 is capped with a 1000 Å layer (not shown) of $Si_3N_4$ to prevent the loss of material from the surface or the introduction of a surface contaminant during the high temperature anneal process. In the prior art, anneals of 15 minutes or longer, typically at 800° C. with the $Si_3N_4$ encapsulant, had been used to activate the ion implanted species, however, such high temperature processing of modulation doped (Al,Ga)As structures is known to cause a drastic decrease in the electron mobility and an increase in the sheet carrier concentration $n_s$, which has been interpreted as being a result of the diffusion of the Si in the (Al,Ga)As into the two-dimensional electron gas channel. Such was described by Ishikawa et al, "The Effect of Annealing on the Electrical Properities of Selectively Doped GaAs/n-AlGaAs Heterojunction Structures Grown by MBE", Japan Jr. Appl. Physics, Vol. 20, No. 11, pL814–L816, November 1981.

In the present invention process, a rapid anneal is used. The ion implanted species are made electrically active by a rapid high tempeature anneal process. In one embodiment this rapid anneal is done with a high intensity light such as an arc light. The anneal process must be of a very short duration (approximately 800°–850° C. for 1-5 seconds so as not to degrade the (Al,Ga)As/GaAs heterointerface and destroy the two-dimensional electron gas channel under the gate region. Measured results are encouraging. Good activation of the implanted Si for the n+ region was achieved ($R \approx 560 \Omega/\square$).

In FIG. 3 the metallic drain and source electrodes 21 and 22 are deposited and delineated using standard photolithographic liftoff techniques. In a preferred embodiment the metallization is AuGeNi. Ohmic contacts are formed to the heavily implanted regions by conventional alloy heat treatment into the semiconductor as shown by the enclosed dashed lines 23 and 24.

The individual devices are electrically isolated one from the other by ion implantation of a neutral species, such as boron, which destroys the two-dimensional electron channel between the devices. A photoresist is used to protect the active devices during the ion implant. Integrated circuits can now be fabricated by connecting the individual devices with upper level metallizations.

In one successful example of the invention the MBE grown single crystalline layer of undoped GaAs was on the order of 1 micron thick, the single crystalline layer of undoped (Al,Ga)As was on the order of 60–100 Å thick and the single crystalline layer of n+ doped (Al,Ga)As was on the order of 280 Å thick. These dimensions are exemplary and not limiting.

Figure 4:
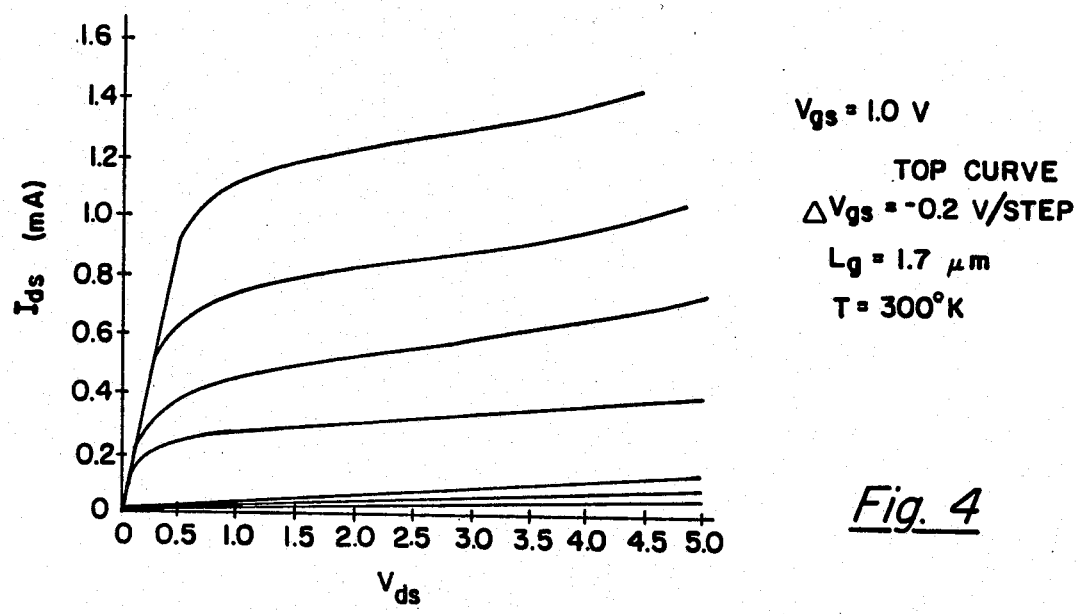
FIGS. 4 and 5 are oscillographic traces of certain operating characteristics of the self-aligned MODFET.
Figure 5:
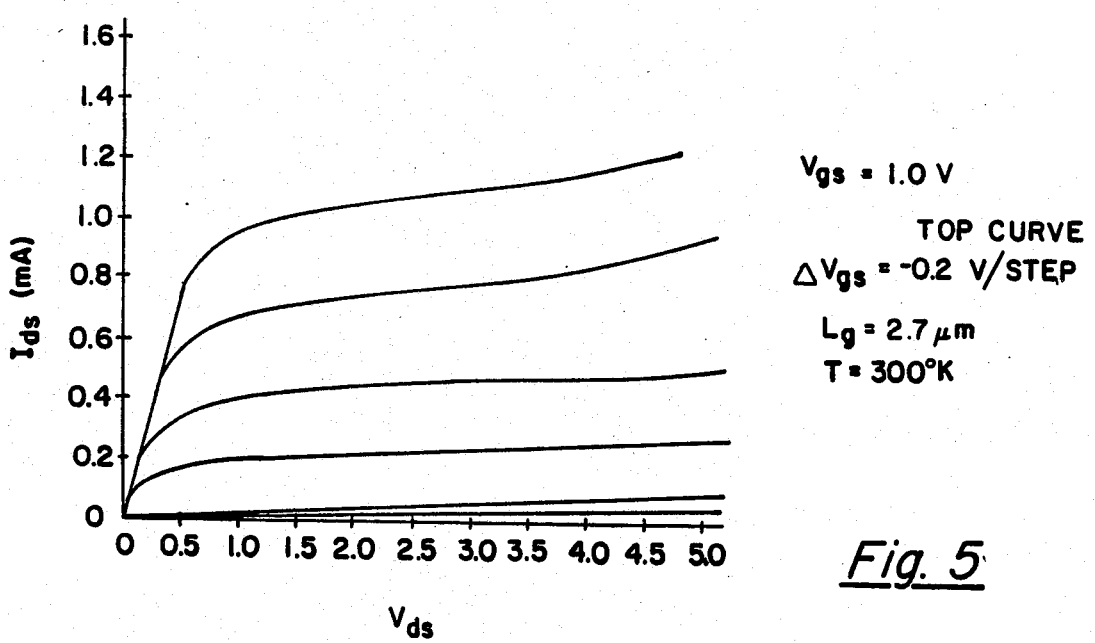

FIGS. 4 and 5 show the oscilloscope waveform drain-to-source I-V characteristics of two self-aligned, rapid annealed MODFETs from a laboratory sample. The measured extrinsic transconductance $g_m$ is 100 mS/mm (85 mS/mm) for the device with nominal gate length $L_g$ of 1.7 μm (2.7 μm) at $V_{gs} \approx 1.0$ V. These are considered very good extrinsic transconductance values for MODFET's of these gate lengths prior to the deposition of the first level metal. Very important, is that these MODFETs show a very sharp pinch-off of the conduction channel at the nominal threshold voltage $V_t \approx 0.1$ V. Self-aligned MODFETs ($L_g = 2.7$ μm) fabricated on this same wafer which were annealed in a conventional furnace had leakage currents of over 25 mA/mm in the saturation region for $V_{gs} = 0$ V. It is believed that this leakage current results from the diffusion of Si into the GaAs buffer layer in conventionally annealed MODFETs. No leakage current of this magnitude is observed in the rapid annealed MODFETs.

The embodiments of the invention in which an exclusive property or right is claimed are defined as follows:

1. The method of fabricating an (Al,Ga)As/GaAs field effect transistor comprising:
   providing a semi-insulating single-crystalline GaAs substrate wafer;
   growing by molecular beam epitaxy on said substrate a plurality of successive single-crystalline layers, wherein one of said layers is an undoped GaAs layer, another of said layers is an undoped (Al,Ga)As layer, and still another of said layers is a n+ doped (Al,Ga)As layer;
   depositing a gate electrode on the surface of the final eptaxial grown layer of said plurality of layers;
   ion-implanting with a silicon donor species the regions of the plurality of layers on either side of the gate electrode; and,
   activating the ion-implanted species with a rapid thermal anneal.

2. The method according to claim 1 in which the surface of the substrate wafer is planar and the layers grown thereon are planar.

3. The method according to claim 1 in which the undoped GaAs layer is on the order of 1 μm thick.

4. The method according to claim 3 in which the undoped (Al,Ga)As layer is on the order of 60–100 Å thick.

5. The method according to claim 4 in which the n+ doped (Al,Ga)As layer is on the order of 280 Å thick.

6. The method according to claim 1 in which the gate is titanium tungsten silicide.

7. The method according to claim 1 and further comprising the steps of depositing a metallic source electrode and drain electrode on the surface of said n+ doped (Al,Ga)As layer, and forming alloy ohmic contacts in the heavily implanted regions by heat treatment.

8. The method according to claim 1 in which the GaAs substrate wafer has an orientation of <100>.

9. The method according to claim 1 in which the gate electrode is a MSi$_x$ (where $x \geq 0$).

10. The method according to claim 9 in which the gate electrode is a metal silicide.

11. The method according to claim 9 in which the gate electrode is a metal.

12. The method according to claim 9 in which the rapid thermal anneal is an anneal of 800°–850° C. for 1 to 5 seconds applied such as by a high intensity light.

13. The method according to claim 7 in which the metallic source and drain electrodes are AuGeNi.

14. The method of fabricating an (Al,Ga)As/GaAs field effect transistor comprising:
   providing a semi-insulating single-crystalline GaAs substrate wafer;
   growing by molecular beam epitaxy a single-crystalline layer of undoped GaAs on a surface of said GaAs substrate wafer;
   growing by molecular beam epitaxy a single-crystalline layer of undoped (Al,Ga)As over said layer of undoped GaAs;
   growing by molecular beam epitaxy a single-crystalline layer of n+ doped (Al,Ga)As over said layer of undoped (Al,Ga)As;
   depositing a MSi$_x$ (where $x \geq 0$) gate electrode on the surface of said n+ doped (Al,Ga)As layer;
   ion-implanting with a silicon donor species into said grown layers of n+-(Al,Ga)As, undoped (Al,Ga)As, and undoped GaAs the regions on either side of the gate; and,
   activating the ion-implanted species with a rapid thermal anneal.

15. The method according to claim 14 and further comprising the steps of depositing a metallic source electrode and drain electrode on the surface of said n+ doped (Al,Ga)As layer, and forming alloy ohmic contacts in the heavily implanted regions by heat treatment.

16. The method of fabricating an (Al,Ga)As/GaAs field effect transistor comprising:
   providing a <100>-oriented semi-insulating single-crystalline GaAs substrate wafer;
   growing by molecular-beam epitaxy (MBE) a single-crystalliine layer of undoped GaAs on a surface of said GaAs substrate wafer;
   growing by MBE a single-crystalline layer of undoped (Al,Ga)As over said layer of undoped GaAs;
   growing by MBE a single-crystalline layer of n+ doped (Al,Ga)As over said layer of undoped (Al,Ga)As;
   depositing a metal silicide gate electrode on the surface of said n+ doped (Al,Ga)As layer;
   ion-implanting with a silicon donor species into said grown layers of n+-(Al,Ga)As, undoped (Al,Ga)As, and undoped GaAs the regions on either side of the metal silicide gate;
   activating the ion-implanted species with a rapid anneal of 800°–850° C. for 1–5 seconds applied such as by a high intensity light;
   depositing a metallic source electrode and drain electrode on the surface of said n+ doped (Al,Ga)As layer; and,
   forming alloy ohmic contacts in the heavily implanted regions by heat treatment.

* * * * *